United States Patent [19]
Beilstein, Jr. et al.

[11] Patent Number: 5,614,277
[45] Date of Patent: Mar. 25, 1997

[54] MONOLITHIC ELECTRONIC MODULES—FABRICATION AND STRUCTURES

[75] Inventors: Kenneth E. Beilstein, Jr., Essex Junction; Claude L. Bertin; Wayne J. Howell, both of South Burlington, all of Vt.

[73] Assignee: International Business Machines Corporation, Armonk, N.Y.

[21] Appl. No.: 429,992

[22] Filed: Apr. 27, 1995

Related U.S. Application Data

[62] Division of Ser. No. 252,794, Jun. 2, 1994, Pat. No. 5,517,754.

[51] Int. Cl.$^6$ .......................................... H05K 3/34
[52] U.S. Cl. ........................ 428/40.1; 29/829; 29/840; 269/903; 269/909; 428/40.9; 428/41.9; 428/212; 428/699; 428/914
[58] Field of Search ............................. 428/40.1, 40.9, 428/41.9, 212, 699, 914; 29/829, 840; 269/903, 909

Primary Examiner—Nasser Ahmad
Attorney, Agent, or Firm—Heslin & Rothenberg, P.C.

[57] ABSTRACT

This invention comprises various high production methods for simultaneously forming surface metallizations on a plurality of monolithic electronic modules. Each monolithic electronic module may comprise a single semiconductor chip or multiple semiconductor chips. The methods can employ a workpiece which automatically discontinues side surface metallization between different electronic modules in the stack. Multiple workpieces are interleaved within the stack between the electronic modules. Each workpiece may include a transfer layer(s) for permanent bonding to an end surface of an adjacent electronic module in the stack. This transfer layer may comprise an insulation layer, a metallization layer, an active circuit layer, or any combination thereof. End surface metallization can thus be provided contemporaneous with side surface metallization of multiple electronic modules.

11 Claims, 14 Drawing Sheets

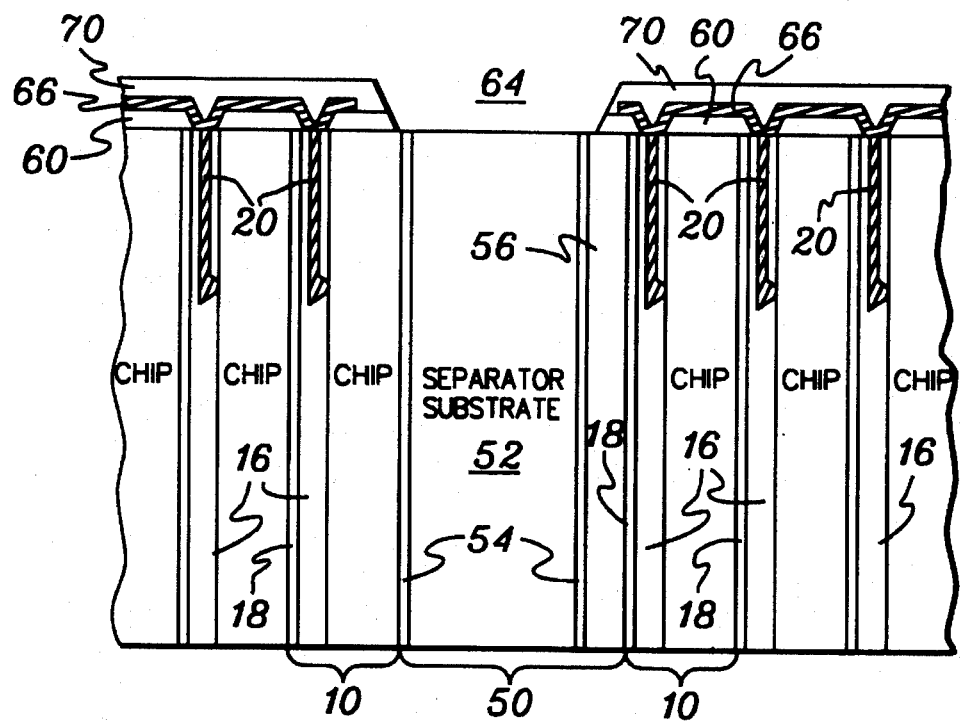
fig. 13
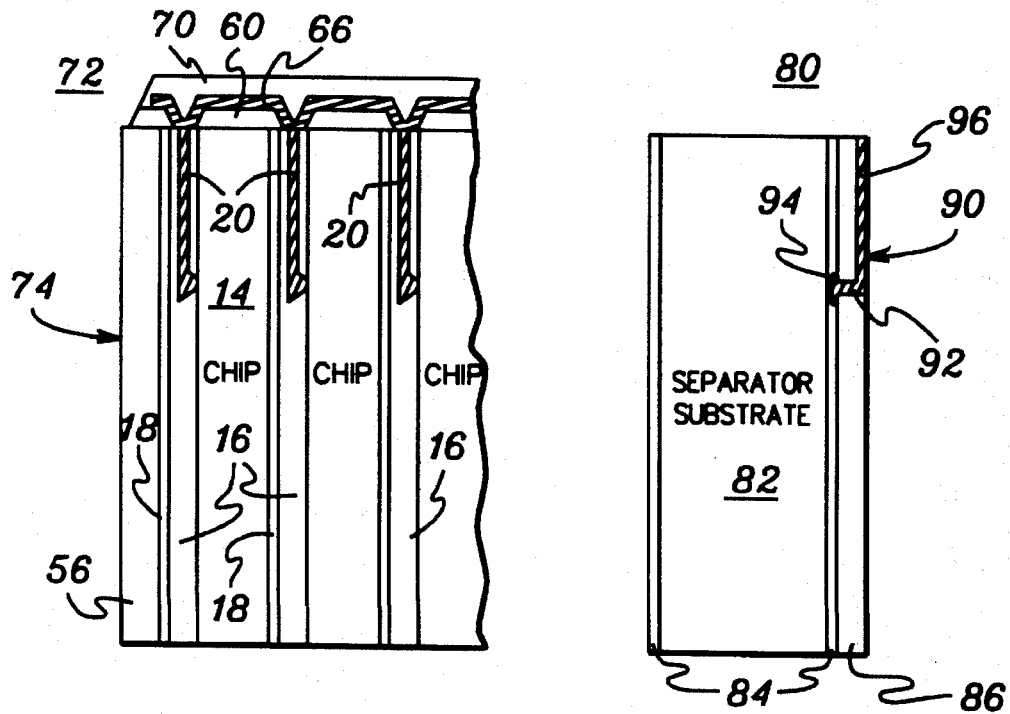
fig. 14
fig. 15

MONOLITHIC ELECTRONIC MODULES—FABRICATION AND STRUCTURES

This application is a division of application Ser. No. 08/252,794, filed Jun. 2, 1994 now U.S. Pat. No. 5,517,754.

TECHNICAL FIELD

This invention is generally related to fabrication of stacked structures from circuit-carrying layers (e.g., integrated circuit chips) with high volumetric efficiency and, more particularly, to a high production method for simultaneously forming surface metallizations on a plurality of monolithic electronic modules, each comprising for example a densely stacked array of multiple semiconductor layers interconnected at least partially by the surface metallization. The invention also relates to methods for establishing a structure(s) on an end surface of a monolithic electronic module.

BACKGROUND ART

Since the development of integrated circuit technology, computers and computer storage devices have been made from wafers of semiconductor material comprising a plurality of integrated circuits. After a wafer is made, the circuits are typically separated from each other by dicing the wafer into small chips. Thereafter, the chips are bonded to carriers of various types, interconnected by wires and packaged. Along with being time consuming, costly and unreliable, the process of physically attaching wires to interconnect chips often produces undesirable signal delays, especially as the frequency of device operation increases.

As an improvement over this traditional technology, stacks or packages of multiple semiconductor chips have become popular, e.g., reference U.S. Pat. No. 4,525,921, entitled "High-Density Electronic Processing Package—Structure and Fabrication;" U.S. Pat. No. 4,706,166, entitled "High-Density Electronic Modules—Process and Product;" U.S. Pat. No. 4,983,533, entitled "High-Density Electronic Modules—Process & Product;" U.S. Pat. No. 5,104,820, entitled "Method of Fabricating Electronic Circuitry Unit Containing Stacked IC Layers Having Lead Rerouting;" and U.S. Pat. No. 5,270,261, entitled "Three-Dimensional Multichip Package Methods of Fabrication."

A typical multichip electronic module consists of multiple integrated circuit chips adhesively secured together as a monolithic structure. A metallization pattern is often provided on one (or more) side surface(s) of the module for chip interconnections and for electrical connection to circuitry external to the module. The metallization pattern can include both individual contacts and bussed contacts. Typically, the multichip module is positioned on a surface of a substrate, which may also have its own metallization pattern.

High production fabrication of monolithic modules is complicated by the presence of the surface metallization(s). Further, fabrication techniques for monolithic modules typically require the use of a ceramic end cap on the module to transform interconnection wiring on an exposed surface of an end semiconductor chip to a side surface metallization interconnecting semiconductor chips in the module. The processes and structures disclosed herein address these and other complications/disadvantages of the existing high density electronic packaging art.

DISCLOSURE OF INVENTION

Briefly summarized, the present invention comprises in a first aspect a process for metallizing a selected side surface of each of multiple electronic modules. The metallizing process initially includes the step of forming a stack of multiple electronic modules such that the selected side surfaces of the multiple electronic modules are coplanar. This stack forming step includes utilizing a workpiece between two adjacent electronic modules in the stack. The workpiece has a first side surface corresponding to the coplanar selected side surfaces of the electronic modules. However, the first side surface of the workpiece has at least a region that is non-coplanar with the coplanar selected side surfaces of the electronic modules. After forming the stack, the process comprises metallizing the selected side surfaces of the electronic modules in the stack to form a stack metallization pattern. The stack metallization pattern is automatically discontinuous at the region of non-coplanarity of the first side surface of the workpiece with the coplanar selected side surfaces of the multiple electronic modules.

In another aspect, the invention comprises a process for applying a transfer layer to an end surface of an electronic module. This process includes: providing a workpiece having multiple layers, one layer of the multiple layers comprising the transfer layer; temporarily affixing the workpiece to the end surface of the electronic modules such that the transfer layer is adhered to the electronic module; and removing part of the workpiece from the electronic module such that the transfer layer remains adhered to the end surface of the electronic module.

In still another aspect, the invention comprises a process for metallizing a side surface of a semiconductor chip. This process includes: providing a workpiece; affixing the workpiece to planar main surface of the semiconductor chip; metallizing the side surface of the semiconductor chip to produce a metallization pattern thereon; and separating the workpiece from the semiconductor chip without damaging the metallization pattern on the side surface of the semiconductor chip.

A process for metallizing a selected side surface and an end surface of an electronic module is also presented. The process includes: providing a workpiece having multiple layers, one layer of the multiple layers comprising a metallization layer; temporarily affixing the workpiece to the electronic module such that the metallization layer of the workpiece is bonded to the end surface of the electronic module; forming a metallization pattern on the selected side surface of the electronic module; and separating a part of the workpiece from the electronic module, wherein the metallization layer remains bonded to the end surface of the electronic module.

In an alternative aspect, the invention comprises a novel workpiece that facilitates fabrication of semiconductor chip structures. The workpiece is designed for inclusion in a stack of multiple semiconductor chips between two adjacent semiconductor chips in the stack. The multiple semiconductor chips in the stack are assumed to have substrates with similar etch characteristics. The workpiece includes a separator substrate which has an etch characteristic corresponding to the similar etch characteristics of the substrates of the semiconductor chips in the stack. A separation material layer is coupled to the separator substrate and has chemical and materials characteristics that differ therefrom such that the separation material may be preferentially removed. The workpiece can be employed to facilitate formation of the metallization pattern on a selected side surface of the semiconductor chips without requiring photolithography to pattern a discontinuity in the metallization on the selected side surface.

In an alternate embodiment, the workpiece comprises a separator substrate having a planar main surface with a removable layer disposed on the planar main surface. A transfer layer is disposed adjacent to an exposed surface of the removable layer. The transfer layer itself has an exposed surface that extends substantially parallel to the planar main surface of the separator substrate. When bonded to a semiconductor chip, the transfer layer is permanently adhered to the semiconductor chip to effectuate transfer of the transfer layer from the workpiece to the adjacent semiconductor chip upon removal of the separator substrate along the removable layer.

To restate, the methods and structures presented herein encompass efficient techniques for establishing metallization patterns on side surfaces of multiple monolithic electronic modules and/or end surfaces of the electronic modules. In a preferred aspect, volumetric processing of the metallizations is accomplished by creating a stack structure using existing semiconductor fabrication technology along with a novel workpiece arrangement which is interleaved within the stack with the electronic modules. The side surface metallization is automatically discontinuous in the region of the workpiece, thereby permitting separation of individual electronic modules from the stack without damage to either the side surface metallization or to any insulating layers. Patterning of the side surface metallization to avoid the workpiece is thus unnecessary and, if desired, no end surface metallization processing is required subsequent to segmentation of the stack if an appropriately designed transfer layer constitutes part of the workpiece. Further, the end semiconductor chip of each monolithic electronic module may comprise an active semiconductor chip and the techniques presented herein will still allow a direct side surface metallization in combination with an end surface metallization.

BRIEF DESCRIPTION OF DRAWINGS

These and other objects, advantages and features of the present invention will be more readily understood from the following detailed description of certain preferred embodiments of the invention, when considered in conjunction with the accompanying drawings in which:

FIG. 13 is partial elevational view of the long stack structure of FIG. 12 subsequent to deposition and patterning of a second insulating layer on the selected side surface of the stack structure;

FIG. 14 is partial elevational view of a monolithic electronic module attained from separation of the long stack structure of FIG. 13 along the temporary adhesive layers of the workpiece;

FIG. 15 is an elevational view of still another alternate embodiment of a workpiece in accordance with the present invention;

BEST MODE FOR CARRYING OUT THE INVENTION

As noted, described herein are processing techniques and related structures for fabricating electronic modules containing one or more semiconductor chips. More specifically, various embodiments are presented for facilitating deposition of a metallization pattern directly on a side surface, and/or an end surface, of a single electronic module or a plurality of electronic modules. In each embodiment, unique removable workpieces are employed to produce the desired monolithic electronic module. The embodiments presented are provided by way of example, and those skilled in the art will note that numerous modifications to the described processes and structures can be made without departing from the scope of the present invention as defined by the claims appended hereto.

Reference is now made to the drawings in which the same reference numbers used throughout different figures designate the same or similar components.

Figure 1:
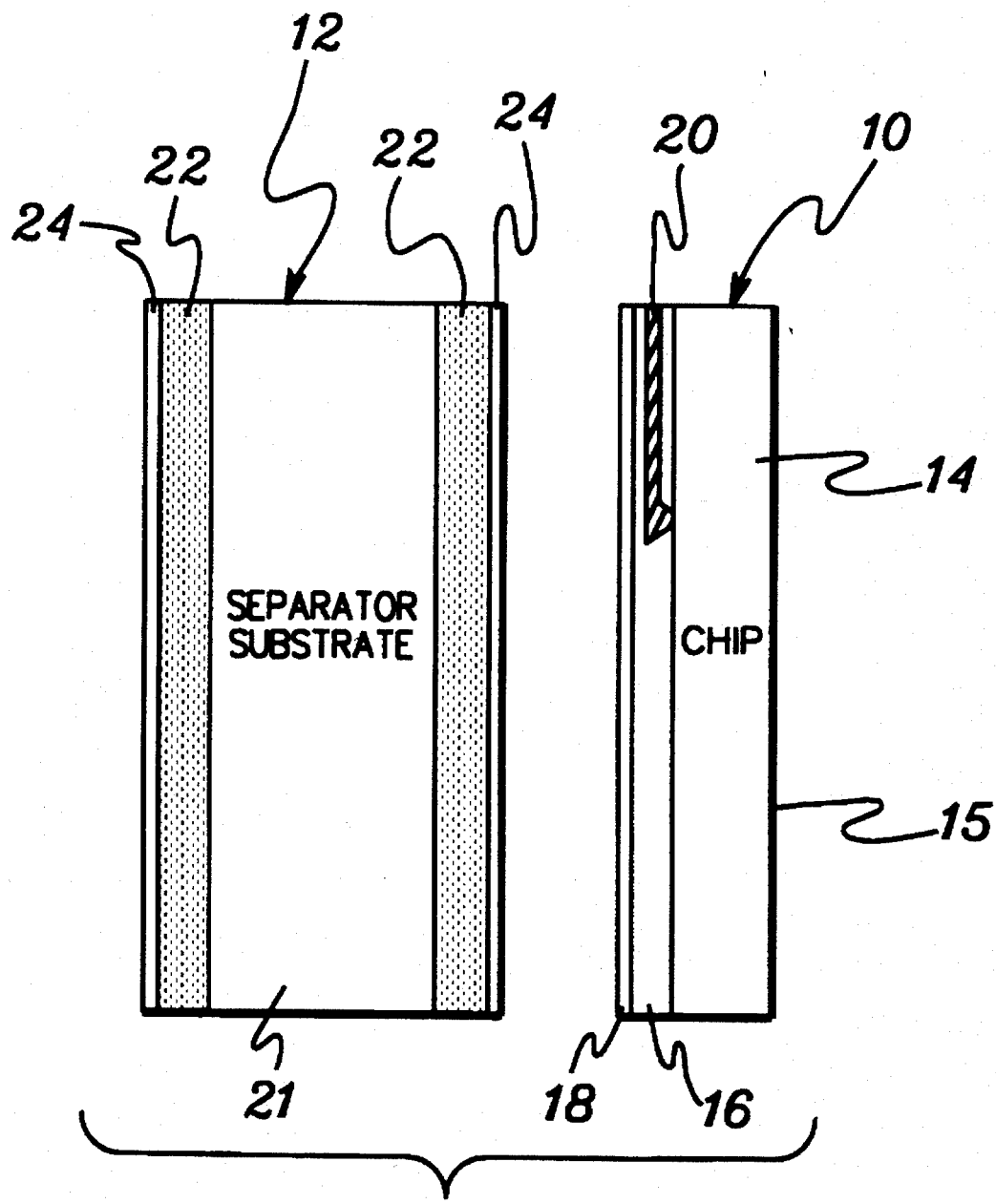
FIG. 1 is an elevational view of one embodiment of two components employed in fabrication of monolithic electronic modules in accordance with a first aspect of the invention.

FIG. 1 depicts a first embodiment of two components for a long stack structure, which when segmented at the workpiece(s) results in the desired multiple monolithic electronic modules. The principal component of such a stack structure is the semiconductor chip, denoted 10. For simplicity, there is assumed to be a plurality of semiconductor chips 10 in each "segment" of a long stack structure, discussed below. A "segment" is a grouping of semiconductor chips in the stack structure which when separated from the stack forms an "electronic module." Various combinations of semiconductor chips can be mechanically and electrically coupled together to form an electronic module. By way of example, semiconductor chip 10 could comprise a memory device and/or a logic device. Chip 10 includes a semiconductor substrate 14, for example fabricated of silicon, upon which a dielectric layer 16 is disposed on a first planar main surface. A second planar main surface 15 of substrate 14 comprises a main surface of semiconductor chip 10. In this embodiment, the other main surface of chip 10 is defined by the exposed surface of a permanent adhesive 18 disposed on dielectric layer 16. Transfer wiring 20 is located within dielectric layer 16 and electrically couples each semiconductor chip to an edge of chip 10. When the chips are integrated into an electronic module these edges comprise a side surface of the module. A side surface metallization (discussed below) will connect to each wiring 20. The dielectric layer of each semiconductor chip, which may comprise a polymeric material, such as polyimide, provides electrical and physical isolation of the respective transfer metallizations.

The second component used to form a long stack structure comprises a workpiece 12 which consists of a separator substrate 21 having parallel planar main surfaces upon which separation material layers 22 are disposed. Workpiece 12 is completed by layers of temporary adhesive 24 on the exposed surfaces of separation material layers 22. Preferably, separator substrate 21 and separation material layers 22 have different chemical and materials properties such that one can be removed in preference to another by methods such as etching or dissolving. In the embodiment presented herein below, separator substrate 21 may comprise silicon, while separation material layers 22 may comprise copper.

Further, separation material selection criteria is such that the material can be removed (e.g., etched) while leaving transfer metallizations 20 uneffected. The separation material can be metal, or any other material that meets the criteria. One possibility is copper with a transfer metallization of gold. The temporary adhesive layer may comprise a thermoplastic material (e.g., Ditac marketed by DuPont) that can withstand stack building and side surface processing, yet be removable for stack segmentation. The permanent adhesive layer comprises a thermoset material that will permanently bond semiconductor chips together during stack processing and its subsequent segmentation.

Figure 2:
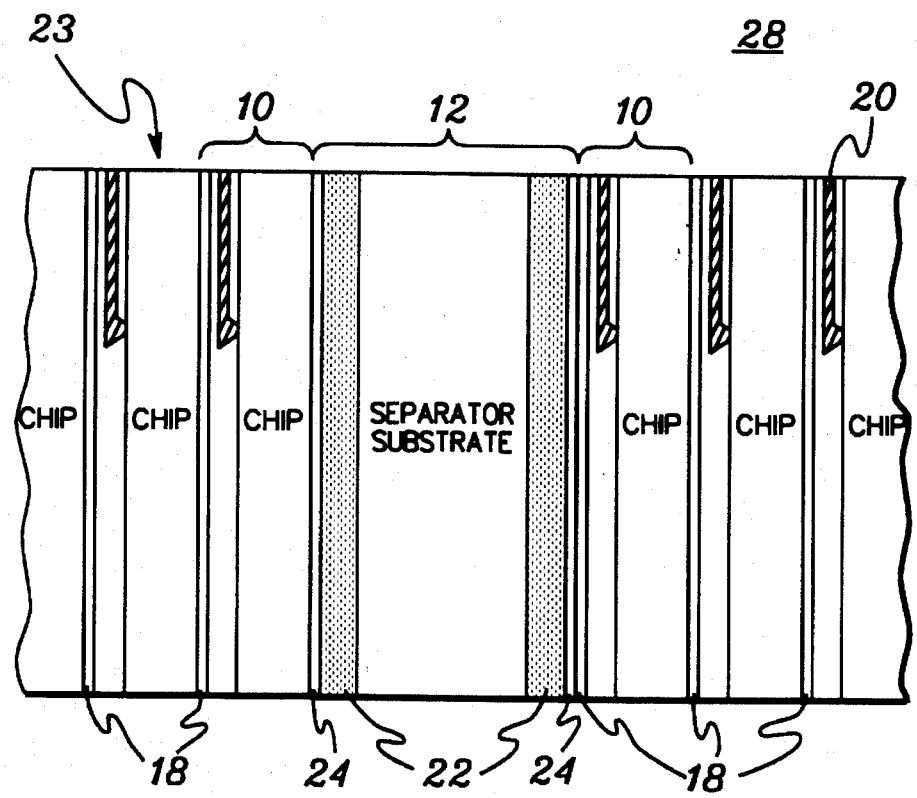
FIG. 2 is a partial elevational view of a long stack structure containing multiple electronic modules for side surface metallization in accordance with the present invention, each electronic module being formed of multiple semiconductor chips.

FIG. 2 depicts a long stack structure, generally denoted 28, wherein multiple semiconductor chips 10 have been laminated together such that a planar main surface of each chip is opposing a planar main surface of an adjacent chip. Long stack structure 28, which may extend either horizontally or vertically, also includes multiple workpieces 12 (only one of which is shown) between two adjacent semiconductor chips 10 of stack 28. Again, workpiece 12 is disposed at the desired location for subsequent segmentation of the long stack structure into monolithic electronic modules (see FIG. 7). FIG. 2 depicts long stack structure 28 subsequent to the chip lamination process and polishing of the selected side surface 23. Polishing occurs until transfer metallizations 20 are exposed at selected side surface 23 of the stack structure. Note with reference to FIG. 2, that the permanent adhesive layer 18 shown adjacent to the temporary adhesive layer 24 is optional. This layer is depicted merely for uniformity among the semiconductor chips 10 of stack structure 28.

Figure 3:
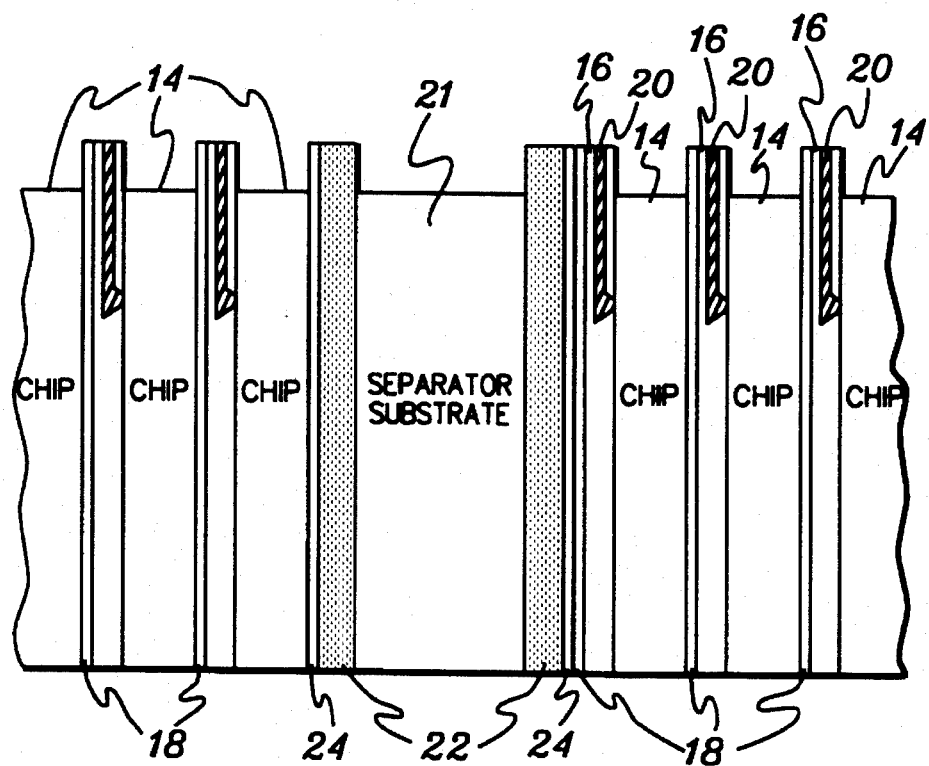
FIG. 3 is a partial elevational view of the long stack structure of FIG. 2 subsequent to substrate removal on the selected side surface of the stack structure.
Figure 4:
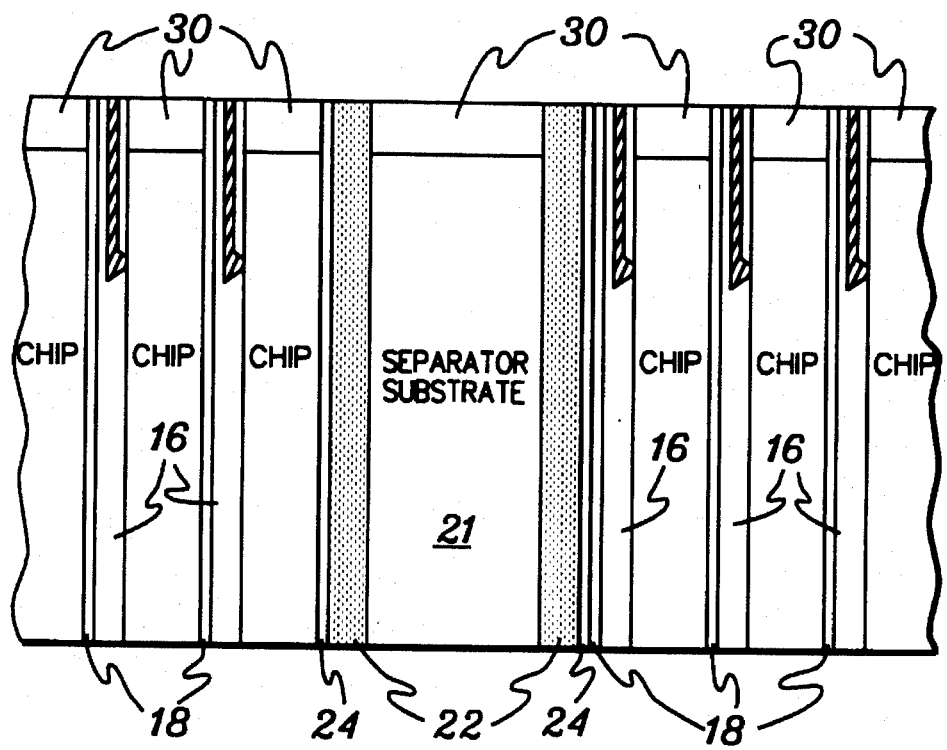
FIG. 4 is a partial elevational view of the long stack structure of FIG. 3 subsequent to insulating and polishing of the selected side surface of the stack structure.
Figure 5:
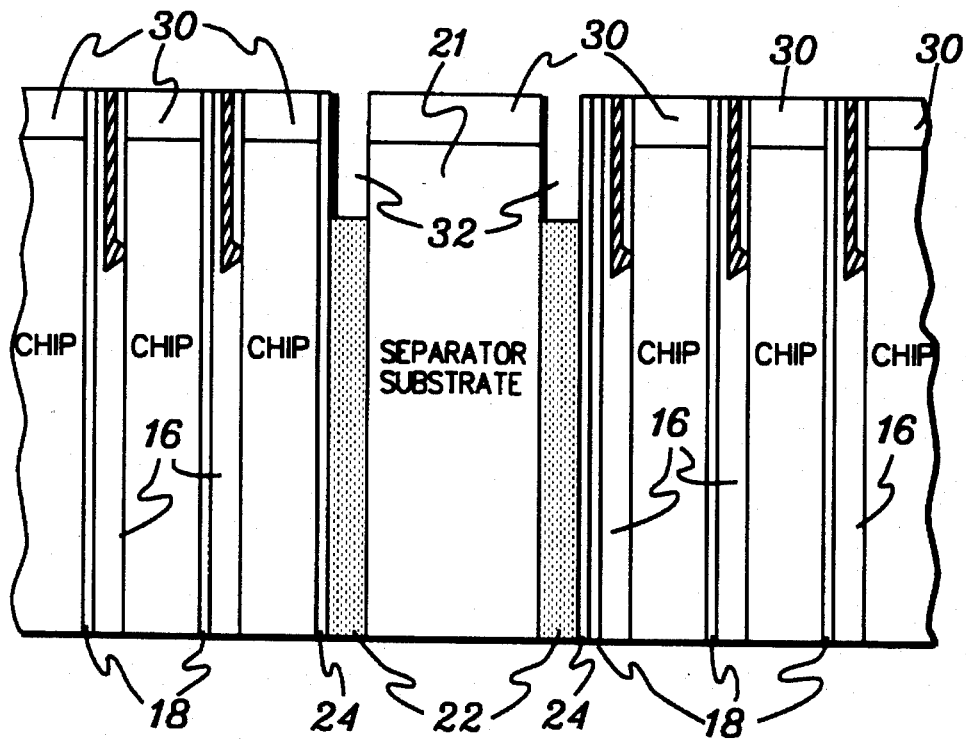
FIG. 5 is a partial elevational view of the long stack structure of FIG. 4 subsequent to preferential removal of the separation material layers along the selected side surface of the stack structure.

The next step in this embodiment is to preferentially etch back semiconductor chip substrates 14 and separator substrate 21, which as noted above may all comprise silicon. FIG. 3 depicts the resultant stack structure. An insulation layer 30 is then formed on the partially etched side surface of the stack structure. As shown in FIG. 4, layer 30 is planarized to expose transfer wirings 20 from chips 10.

A feature of this process embodiment is that separation material layers 22 are next preferentially removed from the selected side surface of the stack structure. This preferential removal results in trenches 32 being formed in the long stack structure such that there are now regions of side surface discontinuity at the workpieces. Preferably, to prevent bridging of the trenches by the side surface metallization, trenches 32 are formed to a depth greater than the anticipated thickness of the side surface metallization. These trenches define the edges of the stack "segments" which when separated will comprise the monolithic electronic modules.

Figure 6:
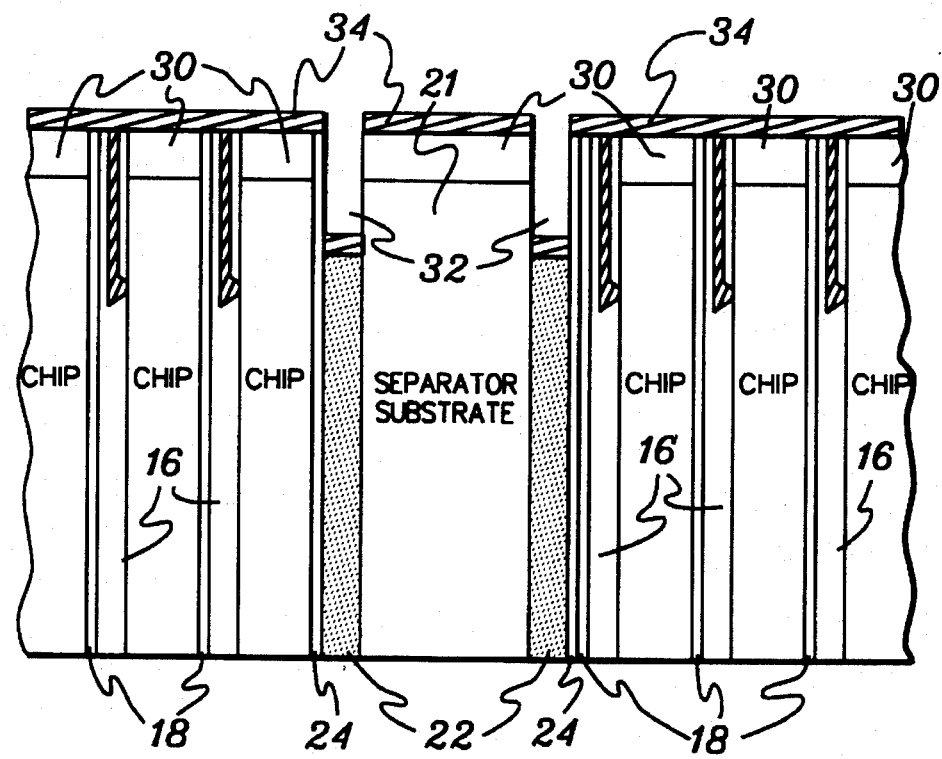
FIG. 6 is a partial elevational view of the long stack structure of FIG. 5 subsequent to side surface metallization showing discontinuity of the metallization at the workpiece(s)

FIG. 6 depicts the stack structure after metallization 34 has been applied to the selected side surface of the long stack structure. Metallization 34 can be formed using various available processing techniques, such as applying and patterning a photoresist, blanket deposition of a metal layer and lifting-off the photoresist/metal structure so as to leave a patterned metal structure on the stack. In addition to the depth, the width of each trench 32 should be sufficient to prevent bridging of the trench by metallization 34. It is important to note that in this processing embodiment no special steps are needed to terminate metallization 34 at a segment edge within the stack structure. The metallization is automatically discontinuous at trenches 32 in the workpiece. Also, various alternate embodiments of separation material layers 22 could be employed in the stack structure. The common characteristic is that a discontinuity exists or is attainable on the selected side surface of the stack structure.

Figure 7:
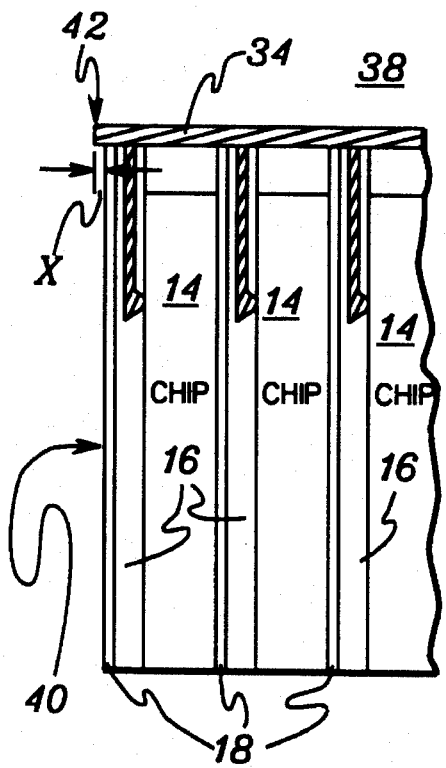
FIG. 7 is a partial elevational view of a resulting monolithic electronic module in accordance with the present invention.

Segmentation of the stack structure at temporary adhesive layers 24 results in multiple monolithic electronic modules 38, one of which is partially shown in FIG. 7. Module 38 is ready for additional processing on an end surface 40, for example, to allow the module to connect to external circuitry. This is facilitated in this embodiment by side surface metallization 34, which extends a distance 'x' beyond end surface 40 of module 38. The extension(s) results from the removal of temporary adhesive 24 after formation of the metallization. Thus, the distance 'x' by which side surface metallization extends beyond end surface 40 is dictated by the thickness of temporary adhesive layer 24. The extension is beneficial in that subsequent metallization (not shown) applied to end surface 40 of module 38 can connect to side surface metallization 34 via a T-connect on the end surface of the module.

Another preferred process for establishing an end metallization on an electronic module is described in U.S. patent application Ser. No. 08/000,826, entitled "Multichip Integrated Circuit Packages and Systems," which is assigned to the same assignee as the present application and which is hereby incorporated herein by reference.

As briefly noted above, various modifications to the basic concepts presented herein are possible. For example, the modules may comprise single semiconductor chips to which side surface metallizations are to be applied. In this connection, reference FIGS. 29 & 30 and the accompanying discussion below. In addition to ease of handling, economies of scale are attained by creating a long stack structure of alternating chips and workpieces for side surface metallization. Further, the separator substrate (21) and the separation material layer(s) (22) of the workpiece could be merged into a single layer, e.g., comprised solely of the separation material. Such an embodiment would require that the separation material have sufficient thickness to provide some structural rigidity, while the embodiment of FIGS. 1–7 does not have this limitation on the separation material.

FIGS. 8–20 present alternate embodiments to the structure/processing of FIGS. 1–7. Note that these alternate embodiments do not utilize a separation material preferential removal step as in FIGS. 5 & 6, but could if desired. Instead, a technology such as photolithography is employed to define the edges of the metallizations on the side surfaces of the electronic modules. A common feature of the embodiments of FIGS. 8–20 is that the workpieces perform two functions; namely, defining the separation interfaces in the long stack structure, and transferring a layer (referred to herein as a "transfer layer") to an exposed surface of an adjacent "segment" of the long stack.

One alternate workpiece structure and metallization processing embodiment is presented in FIGS. 8–14. For simplicity, the same semiconductor chips 10 as depicted in FIG. 1 are assumed to be laminated together in "segments" of a long stack structure, which may extend either vertically or horizontally. Placed between segments in the stack structure are workpieces 50 (FIG. 8), which again define the edges at which the various "segments" of the long stack structure separate to form the electronic modules.

Figure 8:
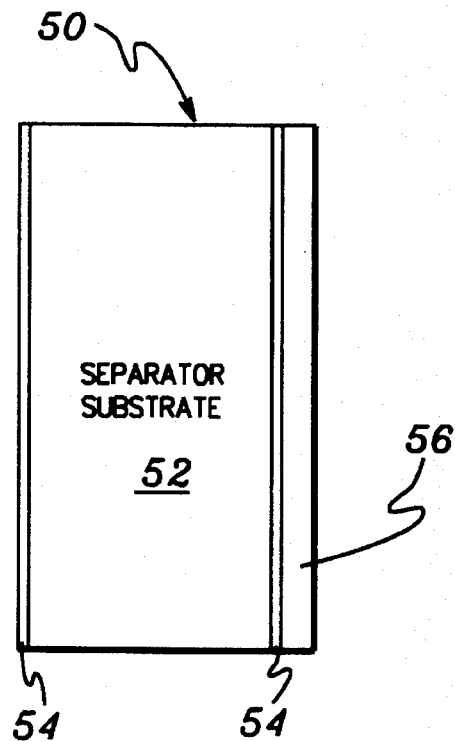
FIG. 8 is an elevational view of another embodiment of a separation workpiece in accordance with the present invention.

As shown in FIG. 8, workpiece 50 includes a separator substrate 52 having temporary adhesive layers 54 on its substantially parallel main surfaces. An insulation layer 56 is also disposed on an exposed surface of a temporary adhesive layer 54 positioned on one side of substrate 52. When complete, insulation layer 56 will be transferred to an exposed end surface of an electronic module. This layer is therefore referred to as the "transfer layer." An alternative embodiment of FIG. 8 would include a permanent adhesive layer 18 adjacent to layer 56 on the workpiece 50. This embodiment eliminates the need for permanent adhesive layer 18 on chip 10 adjacent to workpiece 50 of FIG. 9. This alternative structure embodiment is applicable to the subsequent embodiments presented below. One process embodiment for accomplishing the transfer is progressively illustrated in FIGS. 9–14.

Figure 9:
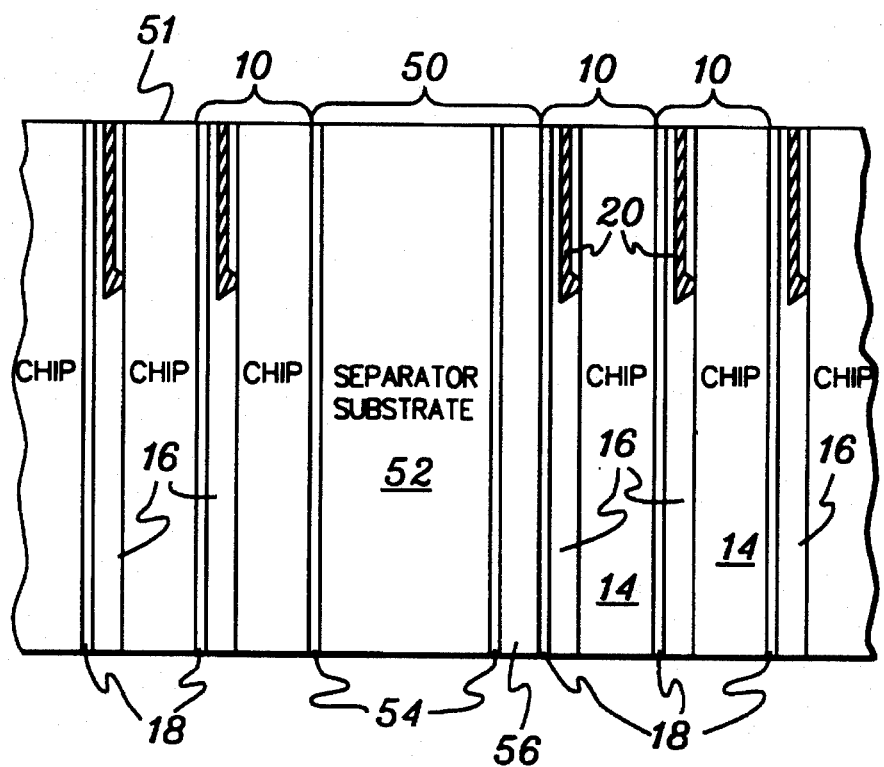
FIG. 9 is a partial elevational view of a long stack structure formed from laminating multiple semiconductor chips with the workpiece of FIG. 8 disposed between two adjacent semiconductor chips in the stack structure.
Figure 10:
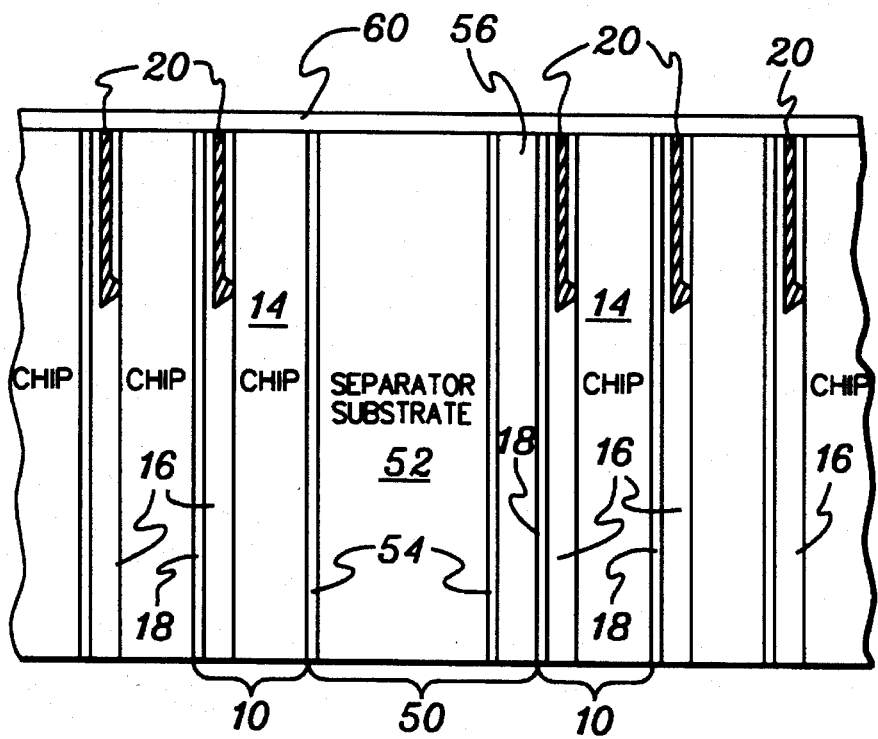
FIG. 10 is a partial elevational view of the long stack structure of FIG. 9 subsequent to deposition of a first insulating layer on the selected side surface of the stack structure.
Figure 11:
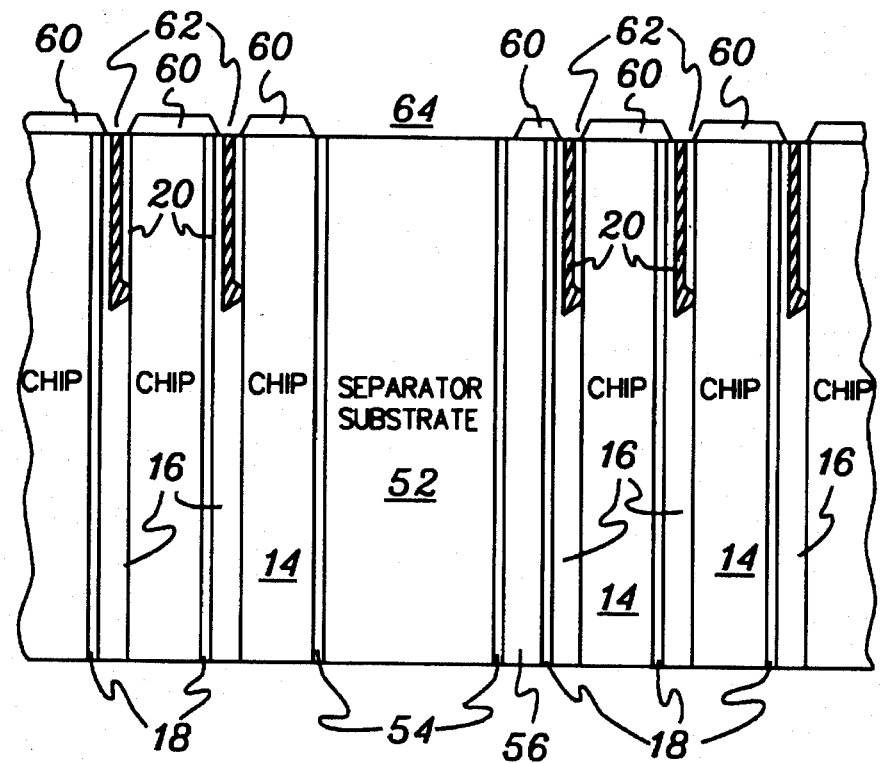
FIG. 11 is a partial elevational view of the long stack structure of FIG. 10 subsequent to patterning and removal of the insulating layer on the selected side surface of the stack structure.
Figure 12:
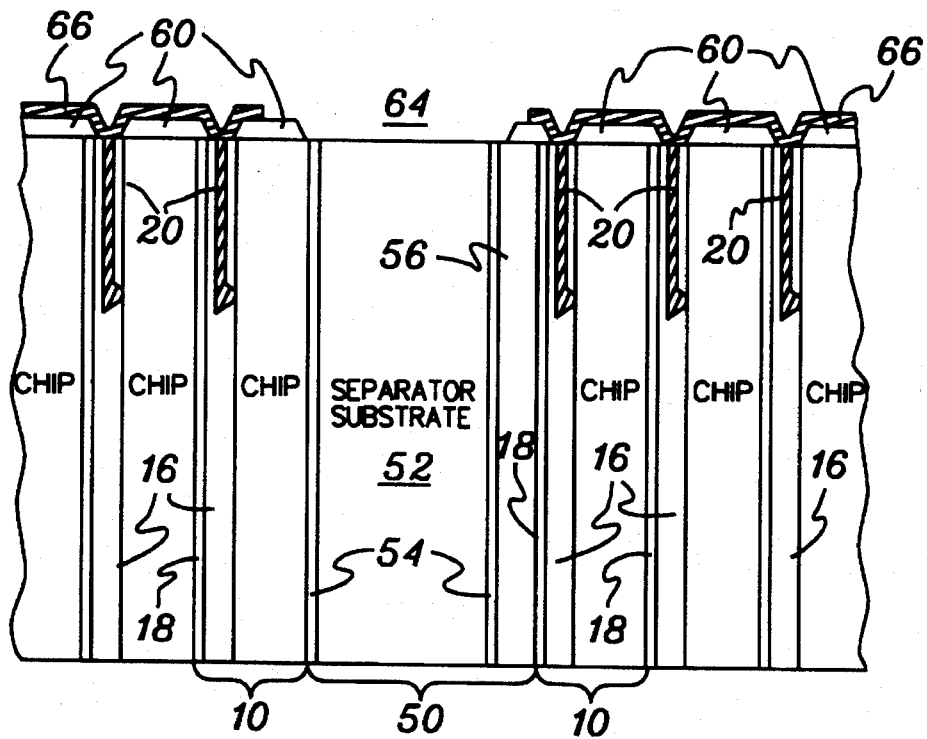
FIG. 12 is a partial elevational view of the long stack structure of FIG. 11 subsequent to metallization of the selected side surface of the stack structure.
Figure 16:
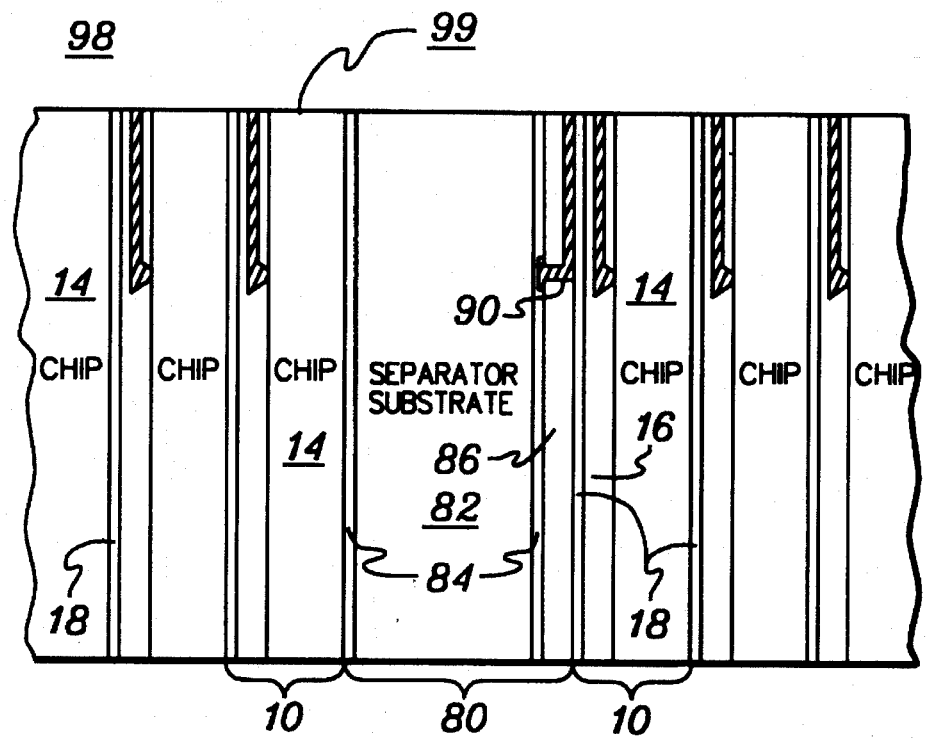
FIG. 16 is a partial elevational view of a long stack structure formed from laminating multiple semiconductor chips and the workpiece of FIG. 15 in a stack structure.

FIG. 9 partially depicts a long stack structure formed as discussed above. The stack structure has a polished side surface 51 which is to receive the side surface metallization. An insulating material 60 (FIG. 10), such as polyimide, is first deposited onto side surface 51 of the long stack, patterned and then etched to define via holes 62 and workpiece openings 64 (FIG. 11). Via holes 62 are defined where transfer metallizations 20 extend to side surface 51 and openings 64 are defined to expose separation workpiece 50. Patterning of insulating layer 60 can be accomplished using various known technologies, e.g., photoresist, develop, insulating layer etch, and resist strip processings. A side surface metallization 66 (FIG. 12) is then formed by depositing and patterning a metal, again using available technologies. Metallization 66 is shown in FIG. 12 to fill via openings 62, but is discontinuous at openings 64.

An additional insulating layer 70 (FIG. 13) may be deposited over metallization 66 and patterned such that opening(s) 64 remains, exposing at least temporary adhesive layers 54. The long stack is then segmented at layers 54 to define monolithic electronic modules 72, one of which is partially presented in FIG. 14. As shown, insulation layer 56 now forms part of module 72 and its exposed surface comprises a new end surface 74 of module 72. As discussed above and in the incorporated application, end surface metallization processing could next occur on exposed end surface 74.

FIGS. 15–20 present still another structure/process embodiment in accordance with the present invention. This process is similar to the process embodiment of FIGS. 8–14, but uses a different workpiece 80. As shown in FIG. 15, workpiece 80 is designed to transfer one or more metallization layers to an adjacent main surface of a chip segment. For example, a thin film end surface metallization pattern 90 can be transferred to an adjacent segment in the stack structure using this process.

Workpiece 80 includes a separator substrate 82 having temporary adhesive layers 84 on its substantially parallel main surfaces. An insulating layer 86 is provided on one exposed surface of one of temporary adhesive layers 84. Layer 86 includes the above-noted end surface metallization 90. In this embodiment, layer 86 with metallization 90 embedded therein comprise the "transfer layer."

Metallization 90 includes one or more metallized vias 92 interconnecting an end metallization pattern 94 and an end transfer wiring 96. Wiring(s) 96 extends to the selected side surface of the long stack when the workpiece is appropriately positioned therein. The advantage to this embodiment is that no end surface processing is required once the individual electronic modules are established upon segmentation of the long stack. The end surface metallization is already completed, having been formed on the workpiece and transferred to the adjacent "segment" as a transfer layer when forming the stack structure.

Figure 17:
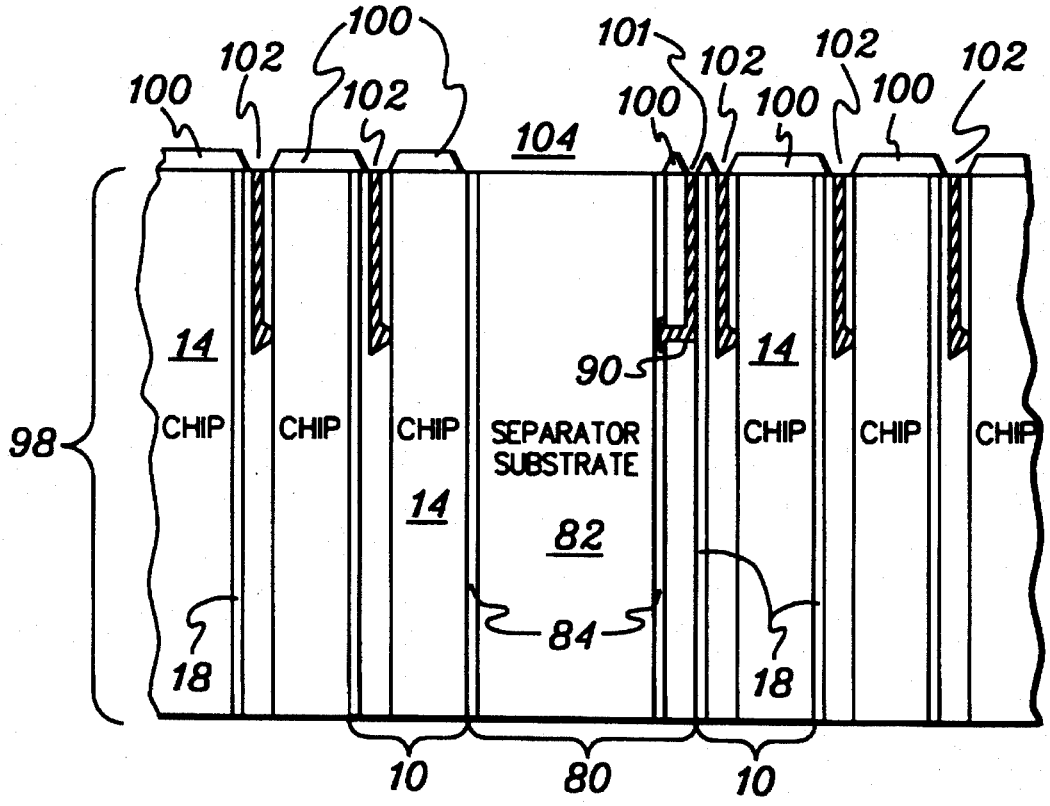
FIG. 17 is a partial elevational view of the long stack structure of FIG. 16 subsequent to deposition and patterning of an insulating layer on the selected side surface of the stack structure.
Figure 18:
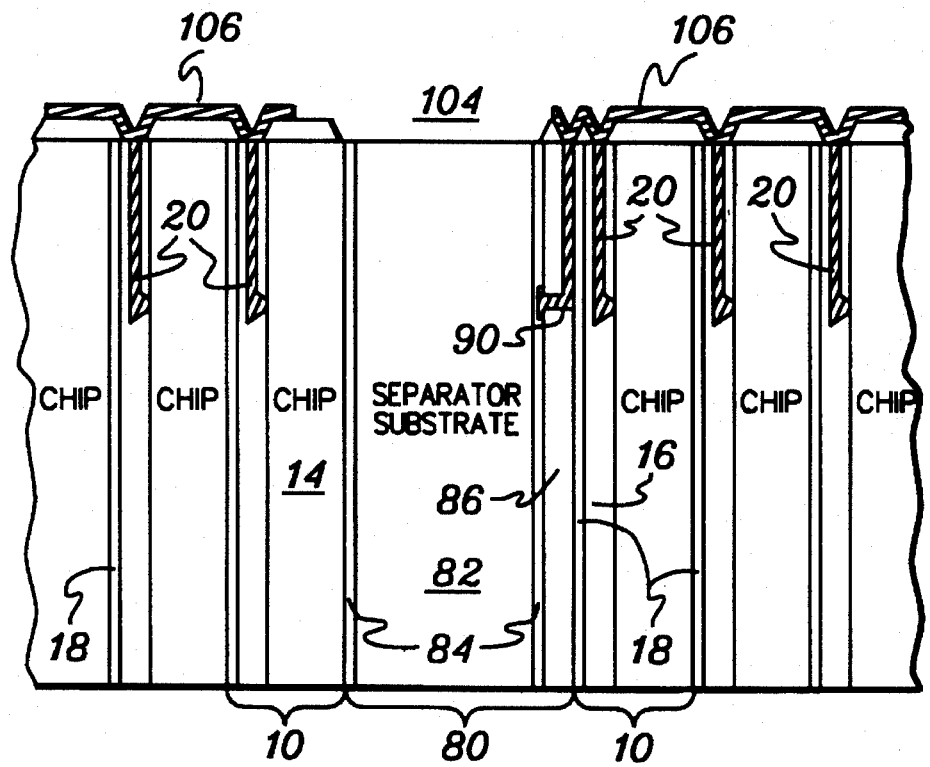
FIG. 18 is a partial elevational view of the long stack structure of FIG. 17 subsequent to depositing and patterning metallization on the selected side surface.
Figure 19:
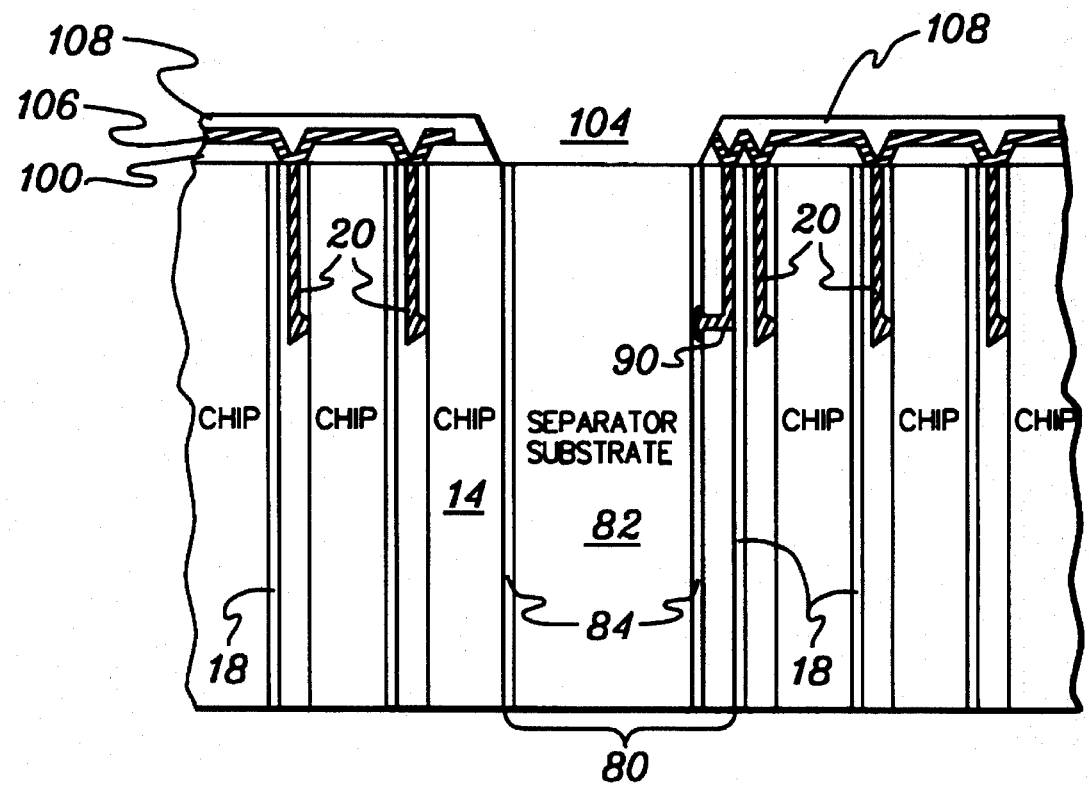
FIG. 19 is a partial elevational view of the long stack structure of FIG. 18 subsequent to deposition and patterning of an insulation layer over the metallization on the selected side surface.

Long stack processing is substantially the same as discussed above with reference to FIGS. 9–14. Specifically, a stack structure 98 (FIG. 16) is formed by laminating multiple semiconductor chips together via permanent adhesive 18 and interspersing workpieces 80 between "segments" of the stack structure. A selected side surface 99 of stack 98 is planarized to expose transfer metallizations 20 from chips 10 and transfer wiring 96 from end surface metallization 90. An insulation layer 100 (FIG. 17 is next deposited and patterned with via holes 102 and workpiece openings 104. Via holes 102 extend to the exposed transfer metallizations 20, while openings 104 expose at least temporary adhesive layers 84 of workpiece(s) 80. An additional via opening 101, also provided in each "segment" is aligned with the exposed end surface metallization 90. Again, metallization 90 and dielectric layer 86 comprise the "transfer layer" to be transferred from workpiece 80 to the adjacent multichip electronic module upon segmentation of stack structure 98. Side surface metallization 106 (FIG. 18) can then be deposited and patterned. This may be followed by deposition and patterning of a side surface insulation layer 108. Opening 104 remains sufficient to expose temporary adhesive layers 84.

Figure 20:
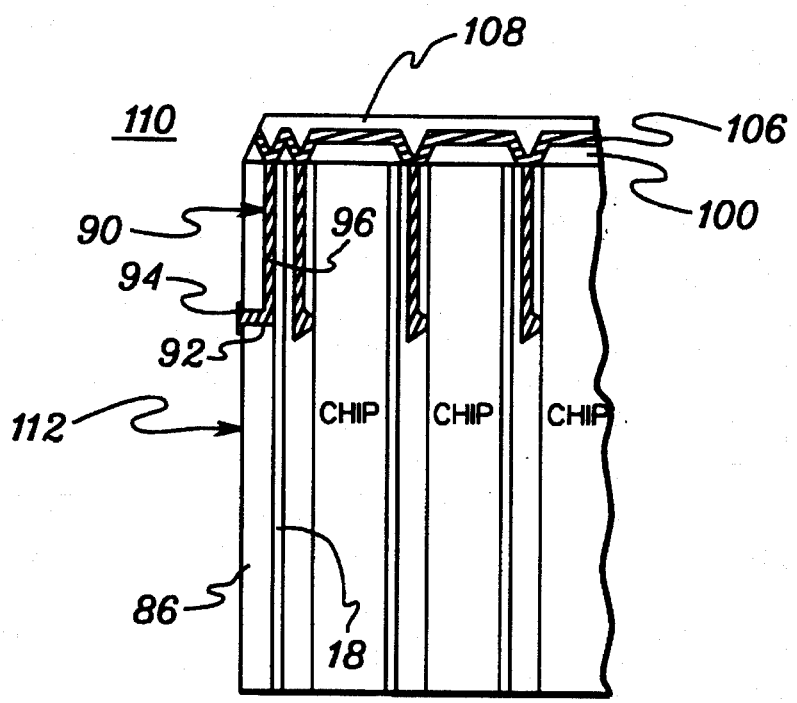
FIG. 20 is a partial elevational view of a monolithic electronic module obtained from separation of the long stack structure of FIG. 19 along the temporary adhesive layers of the workpiece(s)

FIG. 20 partially depicts a monolithic electronic module 110 resulting from segmentation of long stack 98. Module 110 includes an end surface 112 which has contact pads 94 of the transfer layer exposed for electrical connection to external circuitry. Thus, end surface metallization processing subsequent to stack segmentation is avoided.

One variation of this embodiment is to include solder bumps on the contact pads of the transfer layer exposed on the end surface of the resultant monolithic electronic module. Such a structure could be provided for by establishing a layer of solder on pads 94 between the transfer layer and the separator substrate (see FIG. 15). Such a transfer layer would be processed in a fashion similar to that presented above with reference to FIGS. 16–19. Following segmentation and removal of the temporary adhesive layer, the monolithic electronic modules would be subjected to thermal processing to melt the solder material adjacent the contact pads (94) resulting in the formation of solder bumps on the surfaces of the contact pads. An alternative method for forming solder bumps (not shown) on pads 94 (FIG. 20) would be deposit solder directly onto the pads after segmentation. This could be accomplished using any number of known technologies, for example evaporation, screening on a paste, etc, or such self-aligned methods as electroless or electrolytic plating in which metal is deposited only in locations already having exposed conductor.

Figures 21A, 21B, 21C:
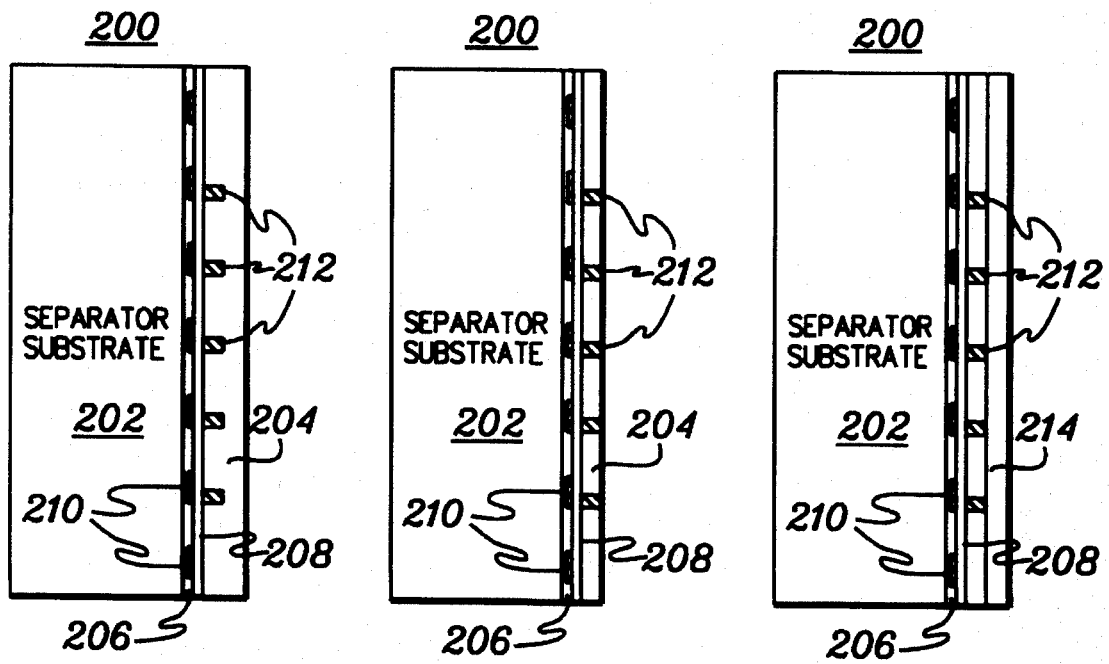
FIGS. 21a–21c are progressive elevational views of a workpiece undergoing fabrication, the workpiece having an active circuitry layer in accordance with an alternate embodiment of the present invention.

FIGS. 21a–21c progressively illustrate fabrication of still another workpiece embodiment pursuant to the present invention. The structure of FIG. 21a is attained by fabricating a device wafer with trenches using standard integrated circuit device fabrication technologies. This device wafer includes an active circuitry layer 208 having input/output pads 210 disposed thereon and a substrate 204 into which conductor-filled trenches 212 (approximately 50–100 μm) have been formed. The device wafer is then adhered to a separator substrate 202 via a temporary adhesive layer 206. Workpiece 200 is assumed to have no active circuits on the separator substrate, which is preferably made of silicon. The temporary adhesive layer 206 may comprise Ditac, referenced above.

Substrate from the device wafer is next thinned from the back side using silicon etching technologies and/or mechanical grinding/polishing technologies as described in U.S. Pat. No. 5,202,754, entitled "Three Dimensional Multichip Packages and Methods of Fabrication," and U.S. Pat. No. 5,270,261, entitled "Three Dimensional Multichip Package Methods of Fabrication," both of which are assigned to the same assignee as the present application. The thinning proceeds until trenches 212 are exposed. Once exposed, the trenches can be used as interconnection vias.

As shown in FIG. 21c, a thin film interconnect layer 214 is built on the device wafer with the interconnection trenches connecting active circuitry layer 208 and interconnection layer 214; and the assembled wafers are diced. Note that use of the separator wafer is important to thinning of the device wafer and to building of the thin film interconnect layer on the device wafer. The separator wafer is used to support the device wafer during processing and will be used to transfer the thinned device wafer to a semiconductor chip or to an end surface of an electronic module comprising multiple semiconductor chips. Further, active circuitry in the thinned device chip can provide a number of functions including buffering, sparing, self-test, and/or other logic processes.

Figure 22:
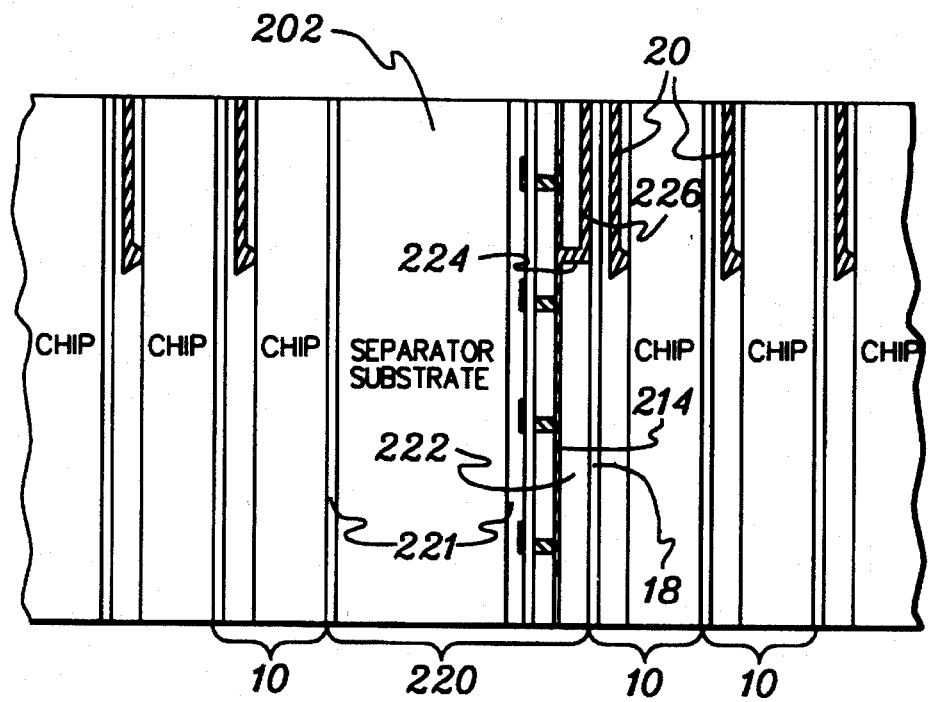
FIG. 22 is a partial elevational view of a long stack structure formed from laminating multiple semiconductor chips with the workpiece of FIG. 21c disposed between two semiconductor chips in the stack structure.
Figure 23:
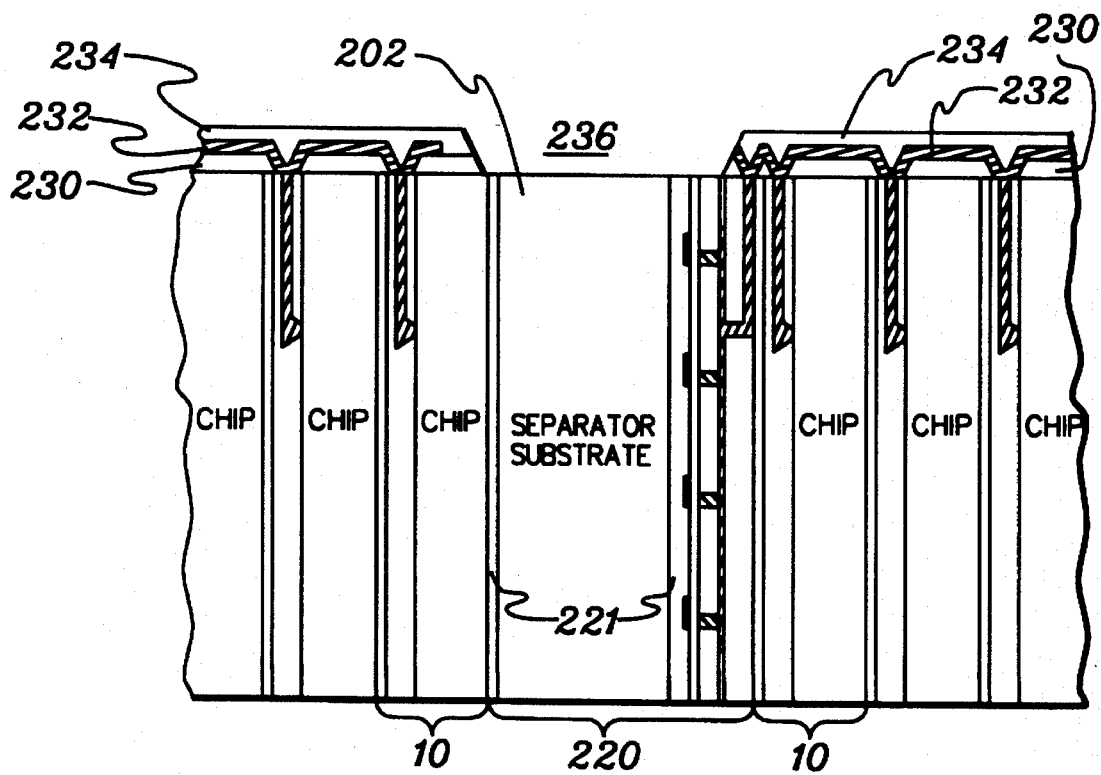
FIG. 23 is a partial elevational view of the long stack structure of FIG. 22 subsequent to metallization processing on the selected side surface of the stack structure.
Figure 24:
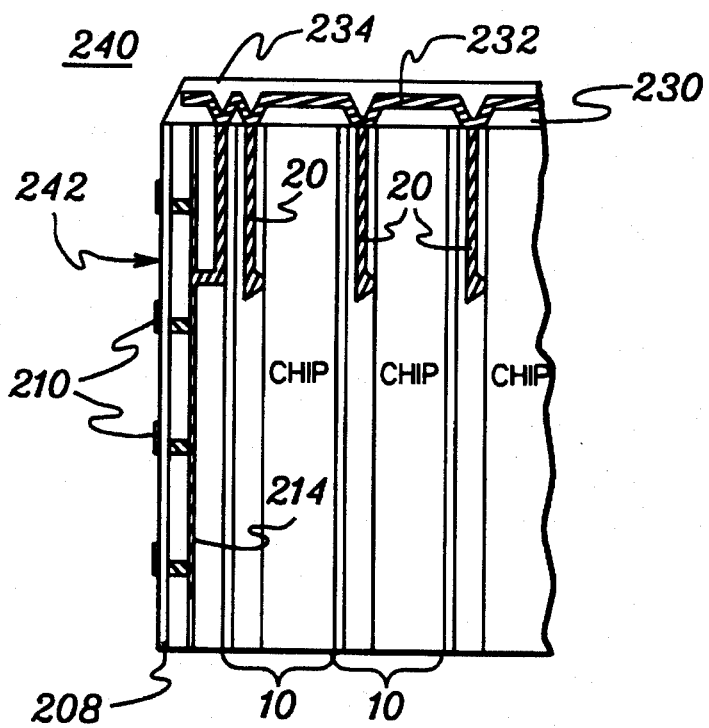
FIG. 24 is a partial elevational view of a monolithic electronic module obtained from segmentation of the long stack structure of FIG. 23 along the temporary adhesive layers of the workpiece.

FIGS. 22–24 depict one processing embodiment using essentially workpiece 200. In these figures interconnection layer 214 is depicted for convenience as a simple metallization pattern within dielectric material. In FIG. 22, separator workpiece 220 comprises workpiece 200 with the addition of a second temporary adhesive layer 221 such that separator substrate 202 has a temporary adhesive layer 221 on each of its main surfaces. The long stack structure is formed as described above, with workpiece 220 being permanently secured on one side to an end semiconductor chip 10 in one adjacent "segment" of the stack structure, and on the other side is temporarily adhered to the back side of semiconductor chip 10 of another "segment" of the stack.

A selected side surface of the stack has a metallization pattern 232 formed thereon within insulation layers 230 and 234, using standard semiconductor processing techniques described above. An opening 236 is retained to expose temporary adhesive layers 221. Upon segmentation at temporary adhesive layers 221, active circuitry layer 208 and thin film interconnect layer 214 are automatically transferred to the end surface of the adjacent electronic module since layer 18 comprises a permanent adhesive. Once transferred, the exposed surface of active circuitry layer 208 becomes an end surface 242 of the monolithic electronic module. (see FIG. 24).

Figure 25A:
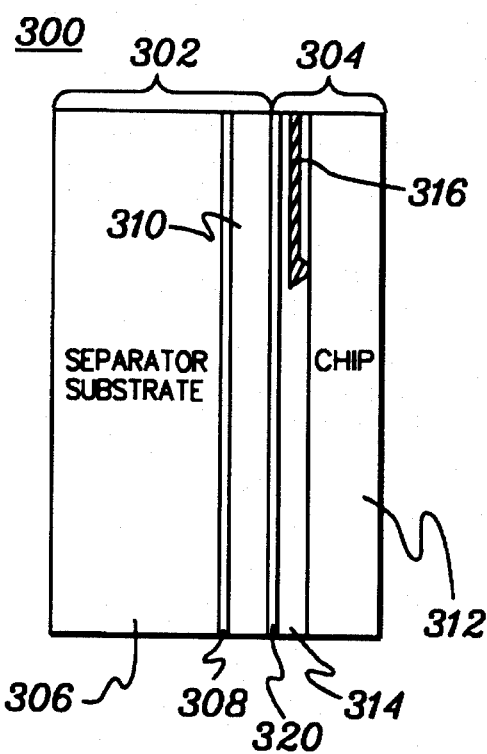
FIG. 25a is an elevational view of one embodiment of a workpiece and semiconductor chip structure in accordance with a further aspect of the present invention.

As briefly noted above, a "transfer layer" of a workpiece can be provided to a single semiconductor chip. FIG. 25a illustrates one embodiment of this concept wherein workpiece 302 transfers an insulation layer 310 to a main surface of a semiconductor chip 304. Chip 304 has a substrate 312 upon which a metallization pattern 316 resides within a dielectric layer 314. A permanent adhesive layer 320 is used to bond workpiece 302 and chip 304, while a temporary adhesive layer 308 is employed within the workpiece between insulation layer 310 and separator substrate 306. In this way, the insulation layer is transferred to the single semiconductor chip upon separation of the workpiece and the semiconductor chip.

Figure 26:
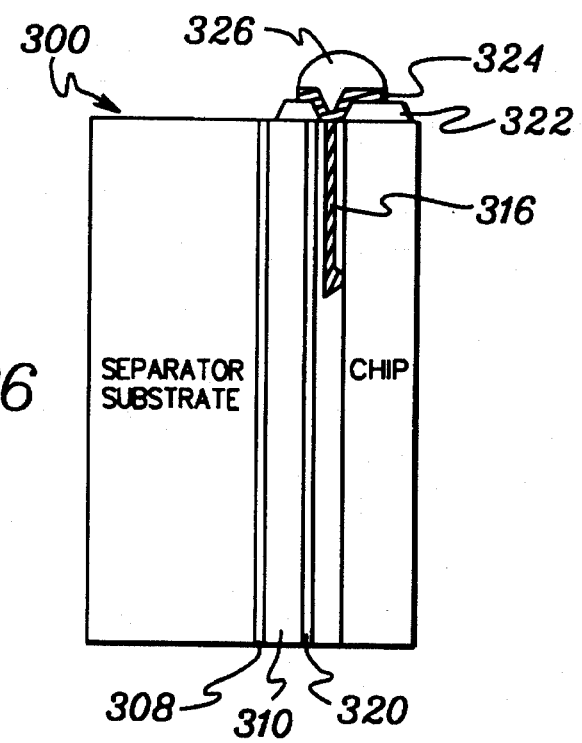
FIG. 26 is an elevational view of FIG. 25a subsequent to side surface metallization and solder bump formation on the semiconductor chip.
Figure 27:
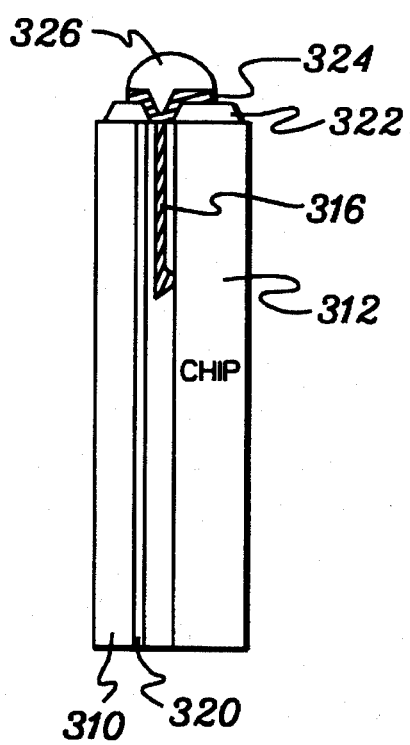
FIG. 27 is an elevational view of the monolithic electronic module resulting from separation of the workpiece and the semiconductor chip along the temporary adhesive layer.

In addition, the combined workpiece/semiconductor chip structure 300 can be provided with a metallization pattern 324 and an insulator 322 on one side surface of the single semiconductor chip. Metallization pattern 324 is shown in FIGS. 26 & 27 to connect to transfer wiring 316 via a metallized via opening. If desired, individual contact metallizations 326 (e.g., solder bumps) could be provided on the metallization pattern 324. Such a structure is depicted in FIG. 27 after separation of the workpiece from the semiconductor chip.

Figure 25B:
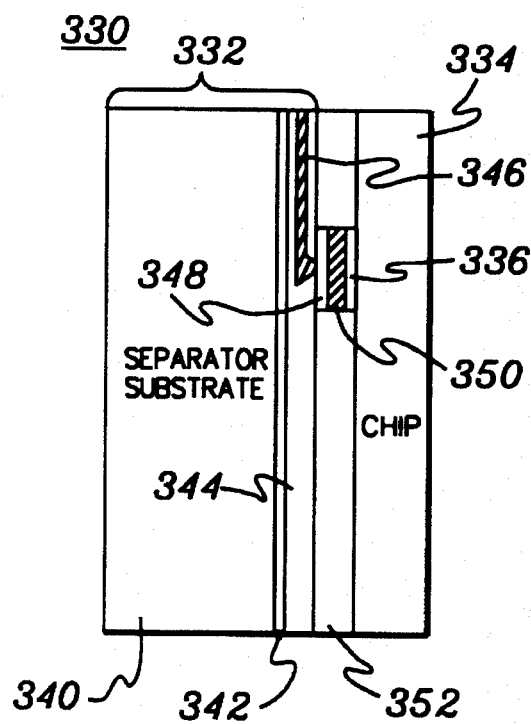
FIG. 25b is an elevational view of an alternate embodiment of a workpiece and semiconductor chip structure in accordance with the present invention.

An alternate combined workpiece/semiconductor chip structure 330 is depicted in FIG. 25b. This particular combination is significant for the concept that the metallization for a semiconductor chip need not be formed directly on the chip itself. Rather, appropriate thin film metallization can be formed as a transfer layer 344 of workpiece 332. This transfer layer 344 is adhered via a temporary adhesive 342 to the separator substrate 340. The transfer metallization 346 is electrically bonded 350 to the semiconductor chip 334, for example, using solder. Bonding is facilitated by appropriate I/O pads 348 and 336 on transfer layer 344 and the semiconductor chip, respectively. Because of the size of I/O pads 348 and 336, the alignment requirements of the separator substrate to the chip are no tighter than for standard chip stacking. After electrical connection, an insulation layer 352 such as an epoxy is preferably injected into the space between the layer and the chip sealing the connection(s).

Figure 28:
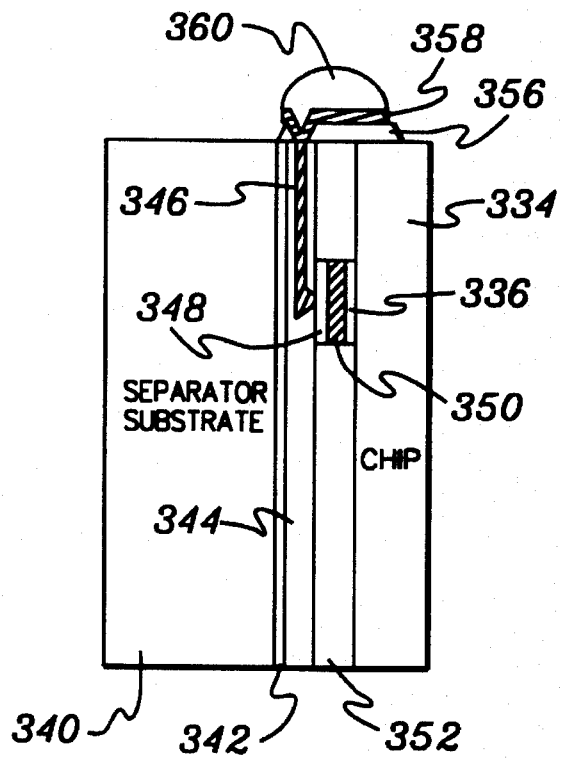
FIG. 28 is an elevational view of the workpiece and semiconductor chip structure of FIG. 25b after formation of the metallization and contact bump(s) on the selected side surface of the semiconductor chip.

As in the above-describe embodiment, the combined structure may then be handled using existing technologies to provide a metallization pattern 358 above an insulation layer 356 on a selected side surface of the combined semiconductor chip and transfer layer. Interconnection contacts 360 (e.g., solder bumps) may be disposed on the metallization pattern 358 as required. After construction of the side surface metallization, the separator substrate and temporary adhesive layer are removed from the combination completing transfer of metallization layer 346 to the semiconductor chip (see FIG. 28).

Figure 29:
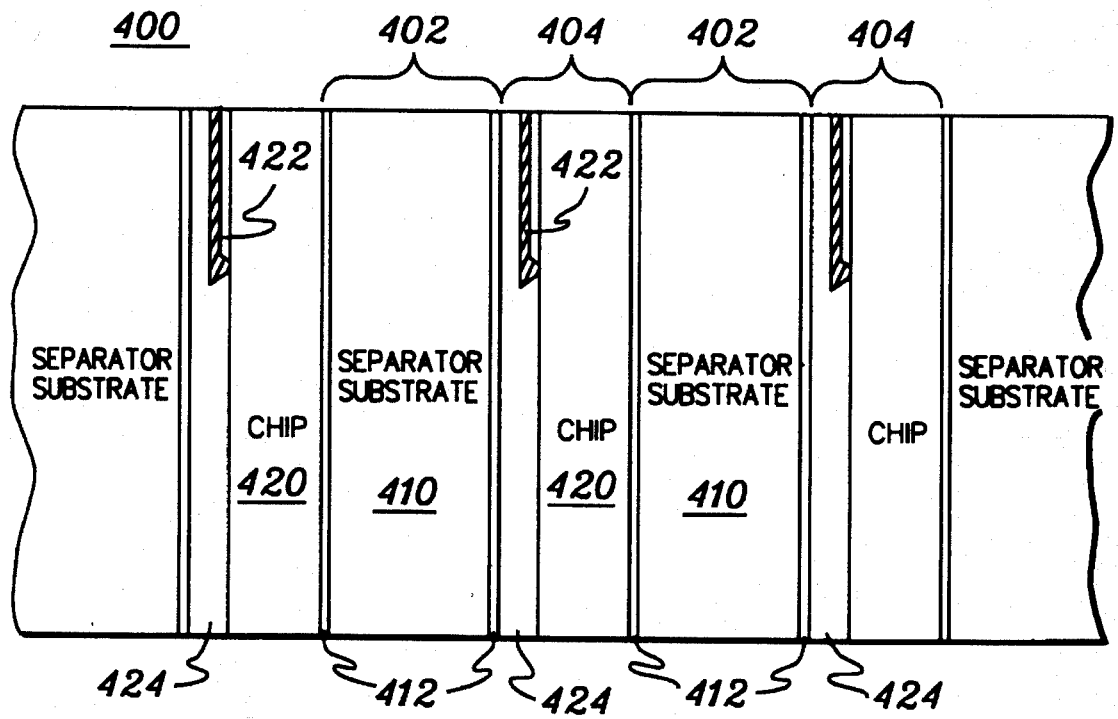
FIG. 29 is a long stack structure formed from alternately laminating multiple workpieces and multiple semiconductor chips, the workpieces comprising still another embodiment of the present invention.
Figure 30:
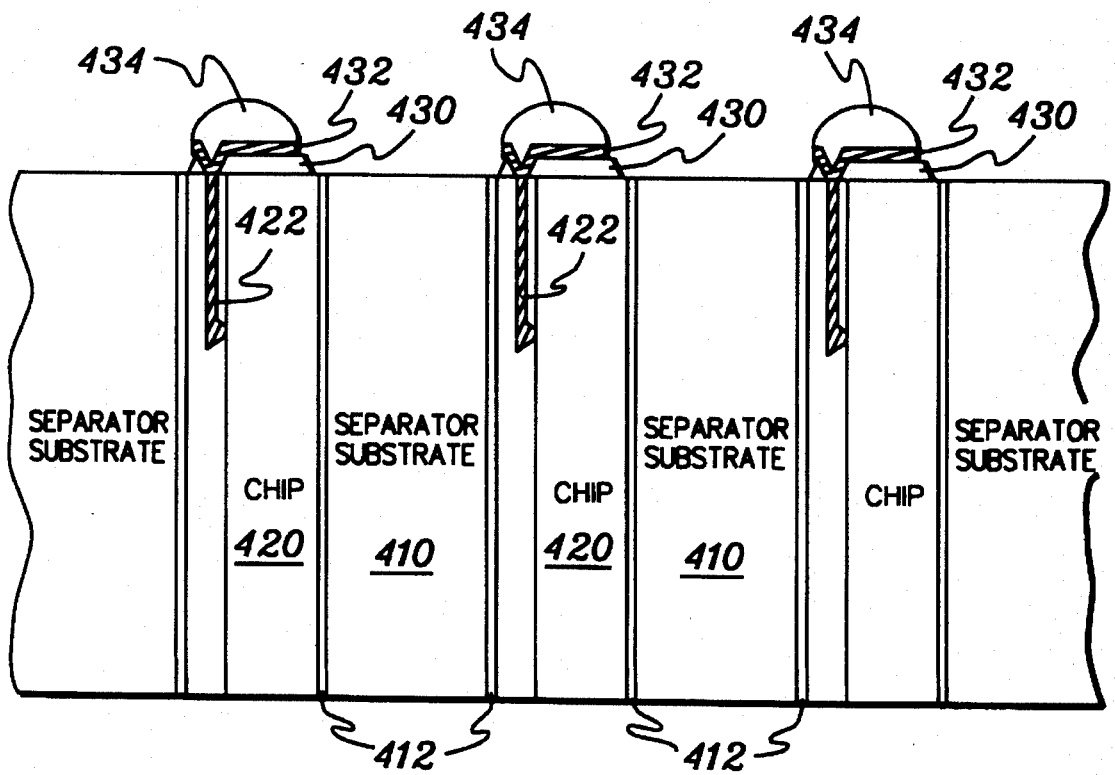
FIG. 30 is a partial side elevational view of the long stack structure of FIG. 29 after formation of a metallization pattern and contact bumps on the selected side surfaces of the semiconductor chips in the long stack structure.

FIGS. 29 & 30 depict one embodiment for volumetric processing of a combined workpiece/chip structure. In particular, workpieces 402 are interleaved with semiconductor chips 404 in a long stack structure 400. In this simple embodiment, semiconductor chips 404 comprise a chip substrate 420 having a dielectric layer 424 thereon within which transfer wiring 422 resides. Temporary adhesive layers 412 are disposed on the main surfaces of a separator substrate 410. Side surface metallization processing can proceed as discussed above. The resultant stack structure is depicted in FIG. 30, wherein individual metallization patterns 432 are shown to reside on each semiconductor chip above which interconnect contacts 434 are positioned. Although no transfer layer is depicted in FIGS. 29 & 30, the concept can be readily accommodated in a volumetric side surface metallization approach as presented. Alternative technologies to the "solder bump" interconnection contacts depicted could also be employed. For example, conductive polymer/epoxies, wire bond pads, TAB pads, surface mount pads, etc. could all be substituted.

Although specific embodiments of the present invention have been illustrated in the accompanying drawings and described in the foregoing detailed description, it will be understood that the invention is not limited to the particular embodiments described herein, but is capable of numerous rearrangements, modifications and substitutions without departing from the scope of the invention.

The following claims are intended to encompass all such modifications.

We claim:

1. A workpiece for facilitating fabrication of semiconductor chip structures, said workpiece being sized for inclusion in a stack of multiple semiconductor chips between two adjacent semiconductor chips in the stack, said multiple semiconductor chips in the stack having substrates with identical etch properties, said workpiece comprising:

a separator substrate having an etch property corresponding to the identical etch properties of the substrates of the semiconductor chips in the stack; and a separation material layer coupled to the separator substrate, said separation material layer having properties different than the properties of the separator substrate such that said separation material layer may be preferentially removed.

2. The workpiece of claim 1, further comprising a temporary adhesive layer coupled to the separation material layer, said temporary adhesive layer facilitating inclusion of the workpiece within the stack of semiconductor chips.

3. The workpiece of claim 1, wherein said separator substrate has a first main surface and a second main surface, said first main surface and said second main surface being parallel, and wherein said separation material layer is physically coupled to said first main surface, and wherein said workpiece further comprises a first temporary adhesive layer physically coupled to the separation material layer and a second temporary adhesive layer physically coupled to the second main surface of the separator substrate.

4. The workpiece of claim 3, further comprising a transfer layer physically coupled to said first temporary adhesive layer, said transfer layer comprising one of an insulation layer, a metallization layer, and an active surface layer.

5. The workpiece of claim 1, wherein said separator substrate has a first main surface and a second main surface, said first main surface and said second main surface being parallel, and wherein said separation material layer comprises a first separation material layer and a second separation material layer, said first separation material layer being physically coupled to said first surface of said separator substrate, and said second separation material layer being physically coupled to said second surface of said separator substrate, and wherein said separation workpiece further comprises a first temporary adhesive layer and a second temporary adhesive layer, said first temporary adhesive layer being physically coupled to said first separation material layer and said second temporary adhesive layer being physically coupled to said second separation material layer.

6. A workpiece for facilitating fabrication of semiconductor chip structures, said workpiece being sized for temporary inclusion in a stack of semiconductor chips each having a planar main surface of similar surface area, said workpiece comprising:

a separator substrate having a planar main surface;

a removable layer disposed on the planar main surface of the separator substrate; and a transfer layer disposed on an exposed surface of the removable layer, said transfer layer having an exposed main surface extending substantially parallel to the said planar main surface of the separator substrate, said main surface of said transfer layer having a surface area the same as the similar surface area of each planar main surface of each semiconductor chip in the stack of semiconductor chips.

7. The workpiece of claim 6, wherein said transfer layer comprises an electrical insulation layer, said electrical insulation layer being for bonding to a semiconductor chip in the stack upon temporary inclusion of the workpiece in the stack of semiconductor chips.

8. The workpiece of claim 6, wherein the transfer layer comprises a metallization layer, said metallization layer being for bonding to an exposed surface of a semiconductor chip upon temporary inclusion of the workpiece in the stack of semiconductor chips.

9. The workpiece of claim 6, wherein the transfer layer comprises an active circuit layer, said active circuit layer being for bonding to an exposed surface of a semiconductor chip upon temporary inclusion of the workpiece in the stack of semiconductor chips.

10. The workpiece of claim 6, wherein the transfer layer comprises a permanent adhesive layer said permanent adhesive layer being for bonding to an exposed surface of a semiconductor chip upon temporary inclusion of the workpiece in the stack of semiconductor chips.

11. The workpiece of claim 6, wherein the removable layer comprises a temporary adhesive.

* * * * *